United States Patent
Bhawmik et al.

(10) Patent No.: US 6,256,759 B1
(45) Date of Patent: Jul. 3, 2001

(54) HYBRID ALGORITHM FOR TEST POINT SELECTION FOR SCAN-BASED BIST

(75) Inventors: Sudipta Bhawmik, Monmouth Junction, NJ (US); Kwang-Ting Cheng, Santa Barbara, CA (US); Chih-Jen Lin, Portland, OR (US); Huan-Chih Tsai, Santa Barbara, CA (US)

(73) Assignee: Agere Systems Inc., Miami Lakes, FL (US)

( * ) Notice: Subject to any disclaimer, the term of this patent is extended or adjusted under 35 U.S.C. 154(b) by 0 days.

(21) Appl. No.: 09/097,488

(22) Filed: Jun. 15, 1998

(51) Int. Cl.$^7$ .................................................. G01R 31/28
(52) U.S. Cl. ........................................... 714/726; 714/727
(58) Field of Search .................................. 714/726, 727, 714/724, 733

(56) References Cited

U.S. PATENT DOCUMENTS

| | | | |
|---|---|---|---|
| 5,329,533 | 7/1994 | Lin | 714/727 |
| 5,450,414 | 9/1995 | Lin | 714/726 |
| 6,059,451 | * 5/2000 | Scott et al. | 371/22.31 |

OTHER PUBLICATIONS

Timing–Driven Test Point Insertion for Full–Scan and Partial–Scan BIST, Kwang–Ting (Tim) Cheng and Chih–Jen Lin, IEEE 1995, pp. 506–514.

Probablistic Treatment of General Combinational Networks, Kenneth P. Parker and Edward J. McCluskey, IEEE Transactions on Computers, Jun. 1975, pp. 668–670.

Testability–Driven Random Test–Pattern Generation, Robert Lisanke, Franc Brglez, Aart J. Degeus and David Gregory, IEEE Transactions on Computer Aided Design, vol. CAD–6, No. 6, pp. 1082–1087.

* cited by examiner

*Primary Examiner*—Ly V. Hua

(57) ABSTRACT

A test point selection method for scan-based built-in self-test (BIST). The method calculates a hybrid cost reduction (HCR) value as an estimated value of the corresponding actual cost reduction for all nodes in a circuit under test. A test point is then selected having a largest HCR. This iterative process continues until the fault coverage of the circuit under test reaches a desired value or the number of test points selected is equal to a maximum number of test points. In an alternative embodiment, the cost reduction factor is calculated for all nodes in the circuit under test, the HCR is calculated for only a selected set of candidates, and the candidate having the largest HCR is selected as the test point. The test point selection method achieves higher fault coverage results and reduces computational processing relative to conventional selection methods.

19 Claims, 13 Drawing Sheets

MACRO-LEVEL 1    MACRO-LEVEL 2    MACRO-LEVEL 3    MACRO-LEVEL 4

$ax + b$ — input
$cx + d$ — input
Output: $acx^2 + (ad + bc)x + bd$
SIMPLIFIED AS
$(ac + ad + bc)x + bd$ COP:
$O_r = 1 - (1 - (ax + b))(a - (cx + d))$
$\quad = a'x^2 + b'x + c'$ SYMBOLIC APPROACH:
$O'_r = a'x^2 + b'x + c$
$\quad = (a' + b')x + c'$ $O_p = ax + b$ $O_p = cx + d$

HYBRID ALGORITHM FOR TEST POINT SELECTION FOR SCAN-BASED BIST

BACKGROUND OF THE INVENTION

1. Field of the Invention

The present invention relates to a hybrid cost reduction technique for test point selection for scan-based built-in self-testing (BIST) of a sequential circuit.

2. Description of the Related Art

Integrated circuits (IC) are tested to ensure that the component is defect-free after being manufactured and/or remains in proper working condition during use. Testing of the IC may be accomplished by applying a test pattern to stimulate the inputs of a circuit and monitoring the output response to detect the occurrence of faults. The test patterns may be applied to the circuit using an external testing device. Alternatively, the pattern generator may be a BIST structure comprising part of the internal circuitry in the IC which generates the test patterns.

Although it is desirable when testing the logic circuit to use exhaustive testing by checking the circuit output response to all $2^n$ possible input permutations, this approach becomes impracticable as the number of input variables n increases. Thus, a related technique, referred to as pseudo-random testing, is employed when the number of input variables is so large that it becomes impracticable to use an exhaustive testing approach. Pseudo-random testing is an alternative technique that generates test patterns in a random fashion from the $2^n$ possible patterns. In this approach fewer than all of the $2^n$ patterns are tested. Because of the relatively low hardware overhead and the simplicity of test pattern generation, pseudo-random testing is a preferred technique for BIST. Practical circuits, however, often contain random pattern resistant faults which result in unacceptable low fault coverages for a reasonable test length. Under these circumstances the testability of the circuit may be improved by inserting test points into the circuit.

A conventional scan-based BIST structure is shown in FIG. 1 and disclosed in U.S. Pat. No. 5,329,533, which is herein incorporated by reference. In order to test a sequential circuit it must first be converted to either a full or partial-scan circuit. This conversion may be realized by replacing some or all of the flip-flops in the circuit under test with scan flip-flops and connecting the scan flip-flops into one or more scan chains. If all of the flip-flops are replaced, then the circuit under test is a full scan circuit and the network N is a combinational circuit. In a partial scan BIST scheme, only crucial flip-flops selected using a cycle-breaking algorithm, as for example described by Cheng and Agrawal, "A Partial Scan Method for Sequential Circuits with Feedback," *IEEE Transactions on Computers,* vol. 39, no. 4, pp. 544–548, April 1989, which is herein incorporated by reference, are replaced with scan flip flops and the network N is a near acyclic circuit (NAC), that is, a synchronous sequential circuit whose corresponding directed graph G does not contain any cycle with length greater than one.

As shown in FIG. 1, the scan-based BIST structure includes a test pattern generator 100 which supplies random patterns to primary inputs and, via scan chains, to pseudo-inputs (outputs of the scan flip-flops). The test pattern generator 100 includes a linear feedback shift register (LFSR) 110 and a phase shifter (PS) 120. Data from the primary outputs and, via the scan chain, from pseudo-outputs (inputs of the scan flip-flops) are compacted by an output data compactor (ODC) 130 such as a multiple input signature register (MISR) 140 and a space compactor (SC) 150.

To begin testing, the integrated circuit is placed in a test mode during which the bits of a test vector are scanned into the chain of scan flip-flops of the integrated circuit. After the test data is entered, the integrated circuit is returned to a non-test mode during which the scan flip-flops respond to the previously received test data in their usual manner. A predetermined period of time later, the test mode is reentered and the output response to the scan flip-flops is captured.

One or more test points, e.g. control points and/or observation points, may be inserted into the circuit under test to improve the fault coverage. An observation point is inserted at a node to improve the observabilities of the node and all other nodes that directly/indirectly feed the node. The effect of inserting an observation point on the circuit under test 160 is represented by the hatched region in FIG. 2a. FIGS. 2b and 2c illustrate the circuit before and after insertion of the observation point. As is clearly evident from a comparison of FIGS. 2b and 2c, an observation point is implemented by connecting the node to the ODC.

A control point may be inserted at a node to improve controllabilities as well as observabilites of nodes in a circuit. Changing the controllability of a node inherently also changes the controllabilities of nodes influenced by the node as indicated by the shaded region in FIG. 3a. In addition, the observabilites of nodes in the hatched area of FIG. 3a, which includes the shaded region, are altered. FIGS. 3b and 3c illustrate the circuit before and after insertion of a control point. The added gate G in FIG. 3c is either an OR gate (1-control point) or an AND gate (0-control point). Signal t is connected to a random source whose 1-controllability (defined as the probability of having a logic value "1") is 0.5 at the BIST mode. During the normal mode, 1-controllability of signal t is 0 for a 1-control point and 1 for a 0-control point. If the 1-controllability of s is too small, an OR gate is inserted such that during the BIST mode the 1-controllability s' is higher than 0.5. On the other hand, if the 1-controllability of s is too large, an AND gate is added such that the 1-controllability of s' is smaller than 0.5. Regardless of which gate is added, the observabilities of all the nodes that affect s are reduced and, in the worst case is reduced by approximately one half.

Fault simulation is one method of selecting test points by identifying the reconvergent fanout points and gates which block the activation and propagation of faults. These points and gates are classified as good test point candidates. However, fault simulation is costly If in terms of computational complexity and hence, is not practical for relatively large circuits.

An alternative approach is to use testability measures to select test points, as for example controllability/observability programs (COP), as described by F. Brglez, "On Testability of Combinational Networks," *Proc. of International Symposium on Circuits and Systems,* pp. 221–225, May 1984, which is herein incorporated by reference. COP is a well known procedure to estimate the 1-controllability $C_s$ and observability $O_s$ of every signal s in a combinational network. The variable $C_s$ represents the probability that node s has a logic value "1"; whereas $O_s$ represents the probability that the logic value at node s can be observed via at least one of the primary outputs. The variables $C_s$ and $O_s$ are calculated by sweeping the circuit once. Controllabilities and observabilities themselves are not sufficient to determine the selection of test points, however, because they represent a local testability impact rather than a global testability impact due to the insertion of a test point.

R. Lisanke et al., "Testability-Driven Random Test Pattern Generation," *IEEE Tran. on computer-Aided Design,* vol. CAD-6, pp. 1082–1087, November 1987, which is herein incorporated by reference, defines a cost function U that is used to estimate the global circuit testability $$U = \frac{1}{|F|}\left(\sum_{i \in F} \frac{1}{Pd_i}\right) \quad (1)$$

where F is the fault set;

|F| is the cardinality of F; and $Pd_i$ is the detection probability of fault i.

For the stuck-at-fault model, $Pd_i$ may be expressed as one of the following two equations:

$$Pd_{s/0} = C_s \cdot O_s, \text{ for stuck-at-0 fault at s}$$

$$Pd_{s/1} = (1-C_s) \cdot O_s, \text{ for stuck-at-1 fault at s}$$

In the cost function equation above $1/Pd_i$ represents the expected number of pseudo-random patterns needed to be applied to detect fault i. Thus, the cost factor U is an indicator of circuit testability and the objective of test point insertion is to minimize the value U. The value of the cost function U changes once a test point is added and the difference between the cost function values before and after insertion of a test point s is referred to as the actual cost reduction (ACR). Given a fault set F, the ACR for a test point candidate s is defined as $$ACR_s = \Delta U^s = U^s - U^{org} = \frac{1}{|F|}\left[\sum_{i \in F}\left(\frac{1}{Pd_i^s} - \frac{1}{Pd_i^{org}}\right)\right]$$

where $U^{org}$ and $U^s$ are the values of the cost function U, before and after insertion of the test point candidate s, respectively; and $Pd_i^{org}$ and $Pd_i^s$ are the detection probabilities of fault i before and after insertion of the test point s, respectively.

In short, ACR is the average expected test length after inserting the test point s into a circuit. The objective of test point selection is to select a test point that produces the largest ACR. One exhaustive method for selecting a test point is to compute ACR for each possible test point candidate in the circuit. As is readily apparent, the computational complexity when testing relatively large circuits makes this exhaustive approach impracticable.

In addition, ACR calculation results using this method are not perfect indicators for selecting test points in that COP provides only an estimate of true controllability and observability because $Pd_i$ assumes that controllability and observability are independent which is not always true. Testing has shown, however, that the ACRs computed using this technique are sufficiently accurate for relatively large circuits to serve as a reference point for verifying the accuracy of other techniques.

To reduce the complexity of calculating the ACR for every point Seiss, B., Trouborst, P., and Schalz, M., in "Test Point Insertion for Scan-Based BIST", *Proceedings of International Test Conference,* pp. 253–262, April 1989, which is herein incorporated by reference, developed an algorithm that calculates a cost reduction function (CRF) to estimate the reduction of the cost function U due to the insertion of a test point. FIG. 4 is a flow chart of this prior art CRF-based algorithm. At each iteration, CRFs are calculated for every node in the circuit in step 410 from which a relatively small set of potentially good candidates is selected in step 415. Then in step 420 the ACR for every candidate in the set is evaluated and the candidate with the largest ACR value is chosen as the test point in step 425. This iterative process stops when in step 400 the number of test points selected reaches a predetermined user specified limit.

The CRF of all nodes in the circuit may be computed in linear time based on the controllability gradient $Gc_s$ and observability gradient $Go_s$ of the cost function U defined as $$Gc_s = \partial U / \partial C_s$$

$$Go_s = \partial U / \partial O_s$$

The gradients $Gc_s$ and $Go_s$ represent the change rates of the cost function U with respect to an infinitely small change of controllability $C_s$ and observability $O_s$, respectively. Cost function gradient values for all nodes in a circuit may be computed in linear time using the algorithms developed by Lisanke.

Although the CRFs may be computed efficiently these estimated values can deviate significantly from ACRs, especially when the circuit reaches a relatively high fault coverage, for several reasons. First, observability changes as a result of insertion of a control point are completely ignored. The observability changes of nodes in the fanin cone of primary outputs reachable from the control point (hatched and shaded regions in FIG. 3a) are neglected. Second, certain circuit structures and fault sets are assumed during the derivation of the CRF equations. Faults associated with a chain of AND gates or OR gates generally have extremely low detection probabilities and, thus are classified as hard-to-detect faults. By assuming the circuit under test will have these types of structures and associated hard-to-detect faults, the controllability value $C_s$ can be factored out of the CRF equations such that the rest of the terms in the cost function U are independent of $C_s$. This assumption is not typically satisfied in practical circuits and thus, often contributes to errors in the CRFs. The cumulative effects of both of these assumptions may increase the inaccuracy of the CRFs even more.

As a result of the inaccuracy of the CRFs, the test point candidate with the largest CRF generally does not have the largest ACR. Therefore, the CRF-based algorithm explicitly computes ACRs for a set of candidates with relative large CRFs so as not to exclude a test point candidate having the largest ACR but not necessarily the largest CRF. Several constraints must be balanced when determining the set of candidates. On the one hand, since usage of the central processing unit is dominated during calculation of ACRs using the prior art CRF-based algorithm, a relatively large candidate set results in relatively high computational complexity. On the other hand, if the selected candidate size is relatively small, some good test point candidates may be excluded. In summary, the overall performance of the CRF-base algorithm is sensitive to the candidate size set chosen.

Thus, it is desirable to develop a method for efficiently and accurately estimating the ACR values for test point selection in a scan-based BIST architecture so as to reduce the number of nodes in the circuit for which the ACR must be explicitly calculated.

SUMMARY OF THE INVENTION

The present invention is directed to a test point selection method for scan-based built-in self-test (BIST). The method calculates a hybrid cost reduction (HCR) value as an estimated value of the corresponding actual cost reduction for all nodes in a circuit under test. A test point is then selected having a largest HCR. This iterative process continues until the fault coverage of the circuit under test reaches a desired value or the number of test points selected is equal to a maximum number of test points. In an alternative embodiment, the cost reduction factor is calculated for all nodes in the circuit under test, the HCR is calculated for only a selected set of candidates, and the candidate having the largest HCR is selected as the test point. The test point selection method achieves higher fault coverage results and reduces computational processing relative to conventional selection methods.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings wherein like reference numerals denote similar elements through the several views.

DETAILED DESCRIPTION OF THE PRESENTLY PREFERRED EMBODIMENTS

The present invention is directed to a hybrid cost reduction method that generates an estimated value of the corresponding ACR for a particular test point candidates.

Given a fault set F, the ACR for a test point candidate s is defined as $$ACR_s = \Delta U^s = U^s - U^{org}$$

$$= \frac{1}{|F|}\left[\sum_{i \in F}\left(\frac{1}{Pd_i^s} - \frac{1}{Pd_i^{org}}\right)\right]$$

$$= \frac{1}{|F|}\left[\sum_{i \in F_1}\left(\frac{1}{Pd_i^s} - \frac{1}{Pd_i^{org}}\right) + \sum_{i \in F_2}\left(\frac{1}{Pd_i^s} - \frac{1}{Pd_i^{org}}\right)\right]$$

where $U^{org}$ and $U^s$ are the values of the cost function U, before and after insertion of the test point candidate s, respectively; and $Pd_i^{org}$ and $Pd_i^s$ are the detection probabilities of fault i before and after insertion of the test point s, respectively.

It has been recognized that the fault set F can be divided into two fault subsets $F_1$ and $F_2$. For every fault i in $F_1$ the difference between $1/Pd_i^s$ and $1/Pd_i^{org}$ is relatively large and for faults in $F_2$, the difference is relatively small. Since for faults in $F_2$ the difference between $1/Pd_i^s$ and $1/Pd_i^{org}$ is relatively small, a relative good approximation of the contribution of faults in this region to the overall cost reduction can be determined based on the gradients of the cost function U without having to explicitly calculate the detection probabilities. As for the faults in $F_1$, the use of gradients to estimate the cost reduction may introduce significant errors because the difference is relatively large and the assumption of gradients is violated. Thus, new detection probabilities must be explicitly recalculated for the faults in $F_1$. Typically, the size of $F_1$ is significantly smaller than that of $F_2$ and, thus computing new detection probabilities for faults in $F_1$ will not require significant computational time.

A. Calculating HCR for a Full Scan Circuit

In accordance with the invention, two different methods are used to evaluate the HCR depending upon whether the test point candidate is an observation point or a control point.

1. Calculating HCR for an Observation Point

Figure 5:
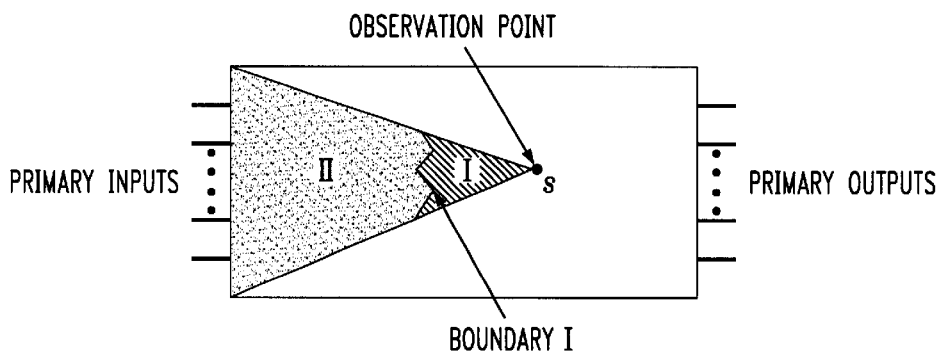
FIG. 5 is a graphical representation for computing the HCR for an observation point in accordance with the present invention.

Insertion of an observation point has an effect on regions I and II of the fanin cone shown in FIG. 5. The propagation of observability changes starts from the observation point candidate s and extends towards the primary inputs. Initially, the observation point candidate s is scheduled into the event list. Then, one node at a time from the event list is selected starting with the observation point candidate s towards the primary inputs and the change in observability as a result of the observation point candidate is computed as the ratio $(G_{Oi} \cdot \Delta O_i)/U^{org}$ to determine if an event occurs, where $G_{Oi}$ is the observability gradient, $\Delta O_i$ is the change in observability and $U^{org}$ is the cost function before insertion of the test point. If the observability change falls below a predetermined observability threshold then no new events are scheduled in the event list and the propagation stops. Otherwise, an event does occur and its immediate fanin nodes are scheduled into the event list. After exhausting all elements in the event list the nodes that stop the propagation of observability changes are identified and denoted in FIG. 5 as Boundary I. Boundary I is used to divide the fault set F into two subsets F1 and F2 as represented by regions I and II, respectively. The observability changes for nodes inside region I are relatively large and create events whereas the observability changes for nodes along Boundary I are relatively small and do not create an event.

The new observabilities for nodes in region I have been calculated and thus, the sum of $1/Pd_i^s - 1/Pd_i^{org}$ for each fault i may be evaluated. As discussed above, each node j on Boundary I has a relatively small change of observabilities and, thus may be treated as a pseudo-observation point with a relatively small observability change $\Delta O_j$. Because the observability change is relatively small, the cost reduction due to the insertion of this pseudo-observation point at j may be approximated by $G_{Oj} \cdot \Delta O_j$. Treating nodes j on Boundary I as pseudo-observation points affects the detection probabilities of faults in their fanin cones denoted as region II in FIG. 5. Therefore the superposition $\Sigma_j (G_{Oj} \cdot \Delta O_j)$ for every node j on Boundary I can be used to estimate the cost reduction from faults in region II without detecting new probabilities for the nodes in this region.

In summary, the HCR for an observation point is defined as $$HCR_s^{OBS} = \sum_{i \in region\ I} \left( \frac{1}{Pd_i^s} - \frac{1}{Pd_i^{org}} \right) + $$

$$\sum_{j \in Boundary\ I} (G_{oj} \cdot \Delta O_j) + \left( \frac{1}{Pd_{s/1}} + \frac{1}{Pd_{s/0}} \right)$$

where $$\sum_{i \in region\ I} \left( \frac{1}{Pd_i^s} - \frac{1}{Pd_i^{org}} \right)$$

is the cost reduction contribution for every fault i inside region I;

$$\sum_{j \in Boudary\ I} (G_{oj} \cdot \Delta O_j)$$

is the cost reduction contribution for faults j along Boundary I as an estimate of the contribution of faults in region II; and $$\left( \frac{1}{Pd_{s/1}} + \frac{1}{Pd_{s/0}} \right)$$

is the cost reduction contribution of two new fanout branch faults as a result of insertion of the observation point when the observation point s is not a fanout stem in the original circuit, where $1/Pd_{s/1}$ and $1/Pd_{s/0}$ are the expected number of random patterns to be applied in order to detect stuck-at fault "1" and "0", respectively.

2. Calculating HCR for a Control Point

Computing HCR for a control point candidate is more complex than that for an observation point. This is because the propagation of new COP values must proceed in a forward direction toward the primary outputs and in a backward direction toward the primary inputs. Starting from the control point candidate s, the controllability change is first propagated in a forward direction to its transitive fanout cone. The new controllability of a node i is a calculated and then the ratio $(G_{Ci} \cdot \Delta C_i)/U^{org}$ is compared to a predetermined threshold to determine if the controllabilities of its immediate fanout nodes need to be updated, where $G_{Ci}$ is the controllability gradient, $\Delta C_i$ is the change in controllability and $U^{org}$ is the cost function before insertion of the test point.

Figure 6:
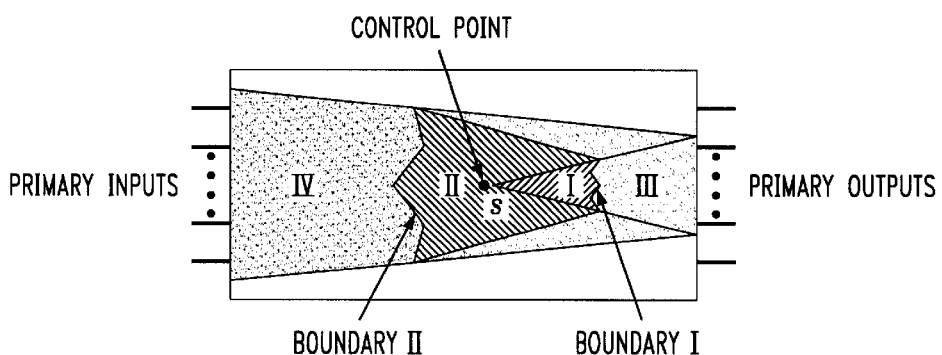
FIG. 6 is a graphical representation for computing the HCR for a control point in accordance with the present invention.

Forward propagation of controllability changes stops at nodes along a Boundary I shown in FIG. 6. At this point, the new controllabilities of nodes in regions I and along Boundary I have been evaluated. The direction of propagation is then reversed backwards towards the primary inputs starting from the nodes along Boundary I.

Backwards propagation stops when the ratio $(G_{Oi} \cdot \Delta O_j)/U^{org}$ is relatively small. Eventually a second set of nodes indicated as Boundary II in FIG. 6 are identified. At this point, the new observabilities of nodes in regions I and II and along Boundaries I and II have been computed.

Since new detection probabilities of faults in regions I and II are available, the cost reduction from faults in these two regions is calculated for each fault i as $1/Pd_i^s - 1/Pd_i^{org}$. Using similar principles to those discussed above for calculating the cost reduction for observation points, every node k on Boundary I is treated as a pseudo-control point with a relatively small change of controllability, the superposition $\Sigma_k (G_{Ck} \cdot \Delta C_k)$ is used to estimate the cost reduction contribution from faults in region III. Similarly, every node j along Boundary II is treated as a pseudo-observation point with a relatively small change of observability, so that $\Sigma_j (G_{Oj} \cdot \Delta O_j)$ represents an estimate cost reduction contribution from faults in region IV.

In short the HCRs for a 1-control point (OR gate) and a 0-control point (AND gate) are defined as $$HCR_s^{OR} = \sum_{i \in region\ I+II} \left( \frac{1}{Pd_i^s} - \frac{1}{Pd_i^{org}} \right) + \sum_{k \in Boundary\ I} (Gc_K \cdot \Delta C_k) +$$

$$\sum_{j \in Boundary\ II} (Go_J \cdot \Delta O_j) + \left( \frac{1}{Pd_{s/0}} + \frac{1}{Pd_{t/0}} \right)$$

$$HCR_s^{AND} = \sum_{i \in region\ I+II} \left( \frac{1}{Pd_i^s} - \frac{1}{Pd_i^{org}} \right) + \sum_{k \in Boundary\ I} (Gc_k \cdot \Delta C_k) +$$

$$\sum_{j \in Boundary\ II} (Go_j \cdot \Delta O_j) + \left( \frac{1}{Pd_{s/1}} + \frac{1}{Pd_{t/1}} \right)$$

Thus, the HCR of a control point candidate comprises four components:

$$\sum_{i \in region\ I+II} \left( \frac{1}{Pd_i^s} - \frac{1}{Pd_i^{org}} \right),$$

the cost reduction contribution from every fault i inside regions I and II;

$$\sum_{k \in Boundary\ I} (Gc_k \cdot \Delta C_k),$$

the estimated cost reduction contribution for faults in region III, where k's are the nodes along Boundary I;

$$\sum_{j \in Boundary\ II} (Go_j \cdot \Delta O_j),$$

the estimated cost reduction contribution from faults in region IV, where j's are the nodes along Boundary II; and $$\left( \frac{1}{Pd_{s/0}} + \frac{1}{Pd_{t/0}} \right)$$

(for an OR-type control point) or $$\left( \frac{1}{Pd_{s/1}} + \frac{1}{Pd_{t/1}} \right)$$

(for an AND-type control point), represent the estimated effects of new faults introduced by the inserted gate, where s is the control point and t is the test input.

A control point has an effect on the testabilites of the nodes in both the fanin and fanout cones. Thus, insertion of a set of pseudo-control points along Boundary I in FIG. 6 affects all faults in regions I–IV. As a result, $\Sigma_{k \in boundary\ I}$ ($G_{Ck} \cdot \Delta C_k$) itself contains a relatively small contribution from faults in regions I, II and IV; however, the impact from region III usually dominates ($G_{Ck} \cdot \Delta C_k$) and, thus, any error as a result of the relatively small contribution from faults in regions I, II and IV is negligible. Furthermore, unlike observation points which always reduce the cost function U when inserted simultaneously, the effects of control points may cancel one another when added at the same time. Therefore, using superposition to estimate the effects of a set of pseudo-control points is a simple, but relatively accurate, approximation of an ACR of a test point s.

B. Computing HCR For a Partial-scan Circuit

Figure 1:
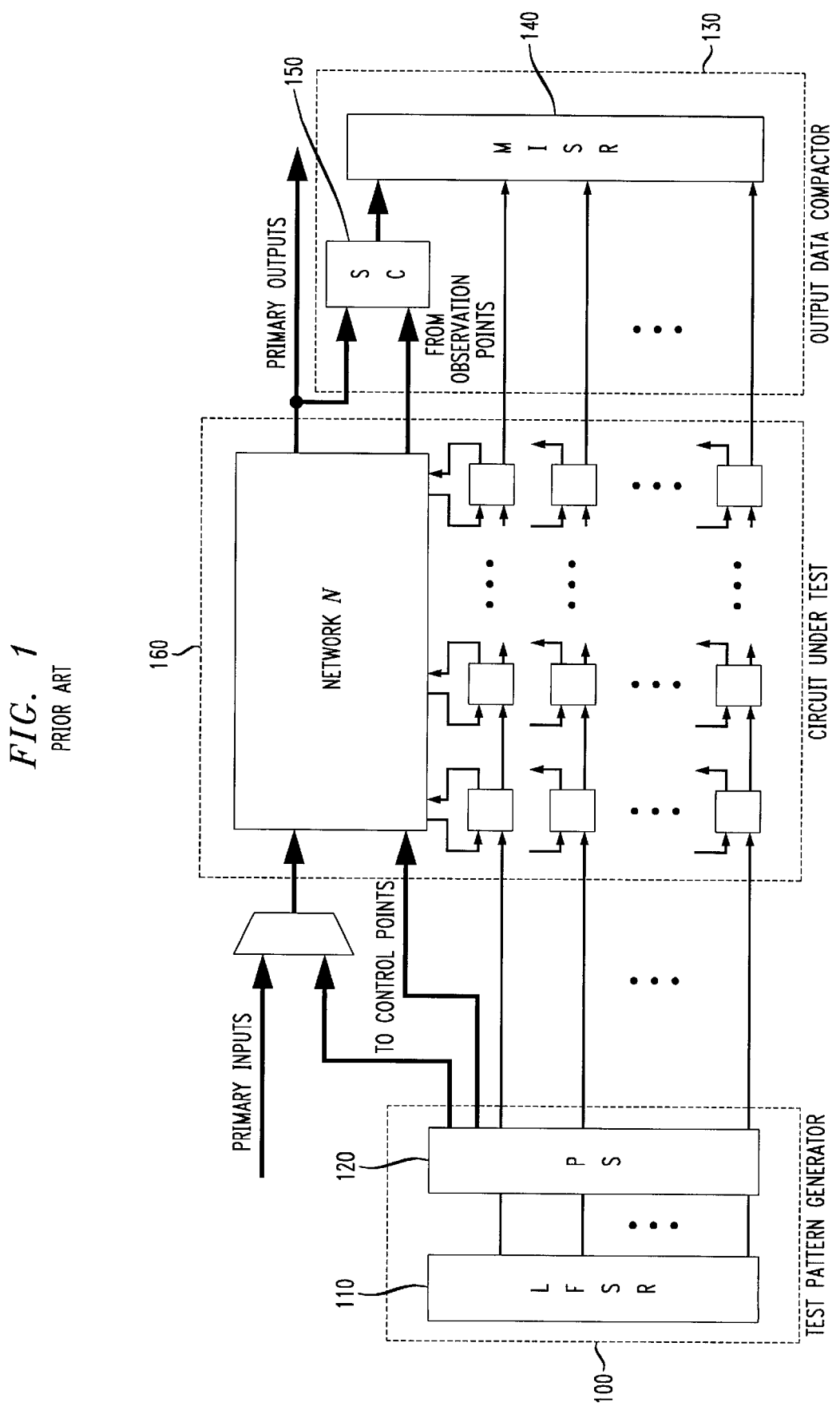
FIG. 1 is a prior art scan-based BIST architecture.
Figure 2A:
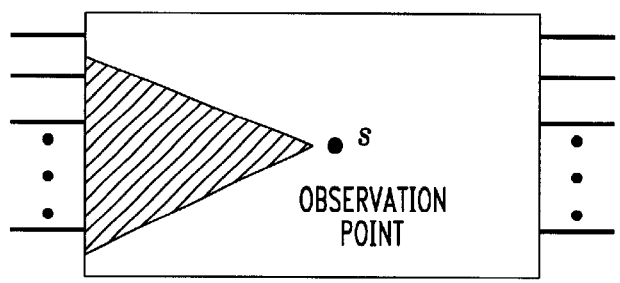
FIG. 2a depicts the effect on a circuit of insertion of an observation point.
Figure 2B:
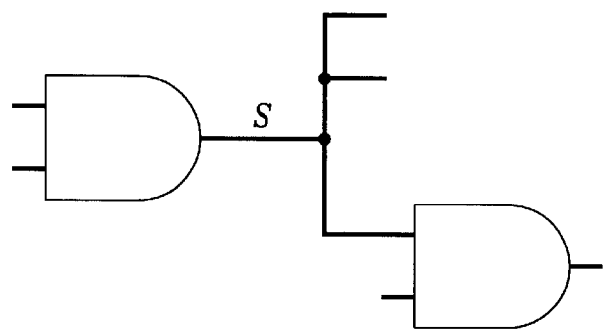
FIGS. 2b and 2c depict the circuit before and after insertion of the observation point.
Figure 2C:
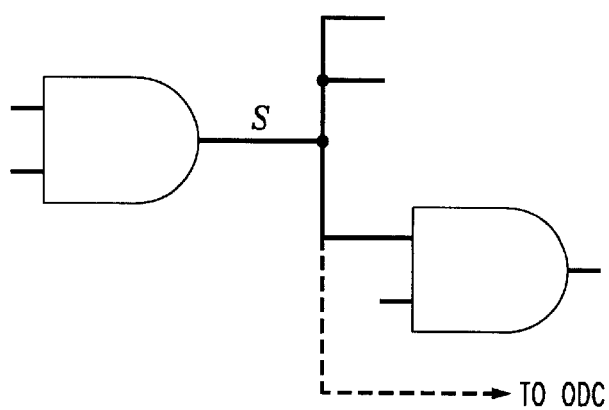
Figure 3A:
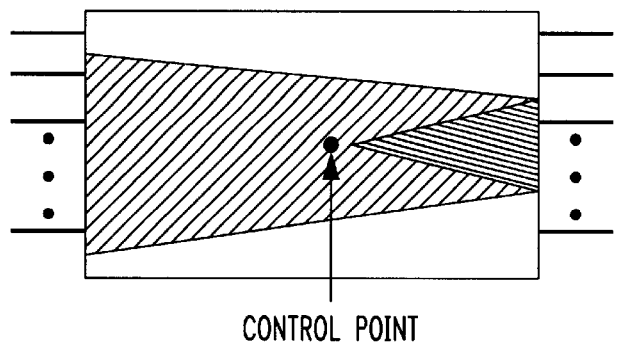
FIG. 3a depicts the effect on a circuit of insertion of a control point.
Figure 3B:
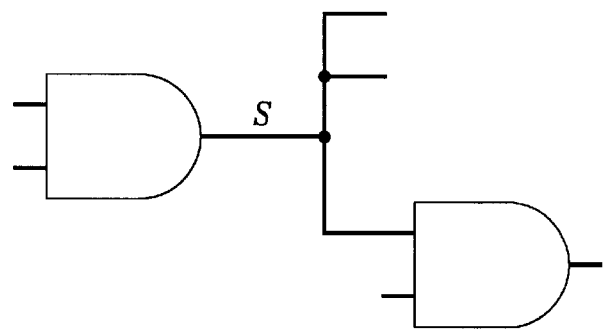
FIGS. 3b and 3c depict the circuit before and after insertion of the control point.
Figure 3C:
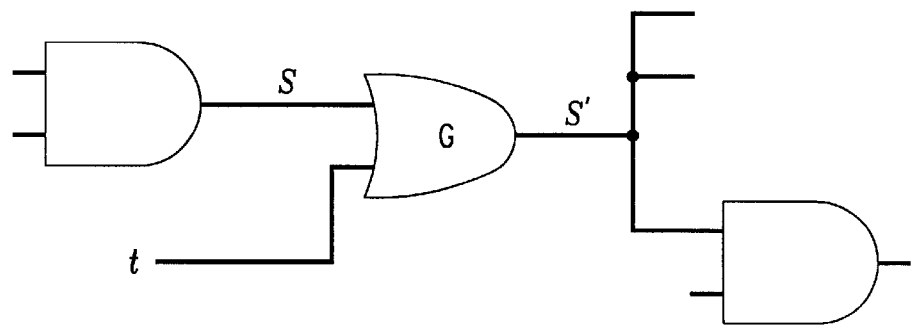
Figure 4:
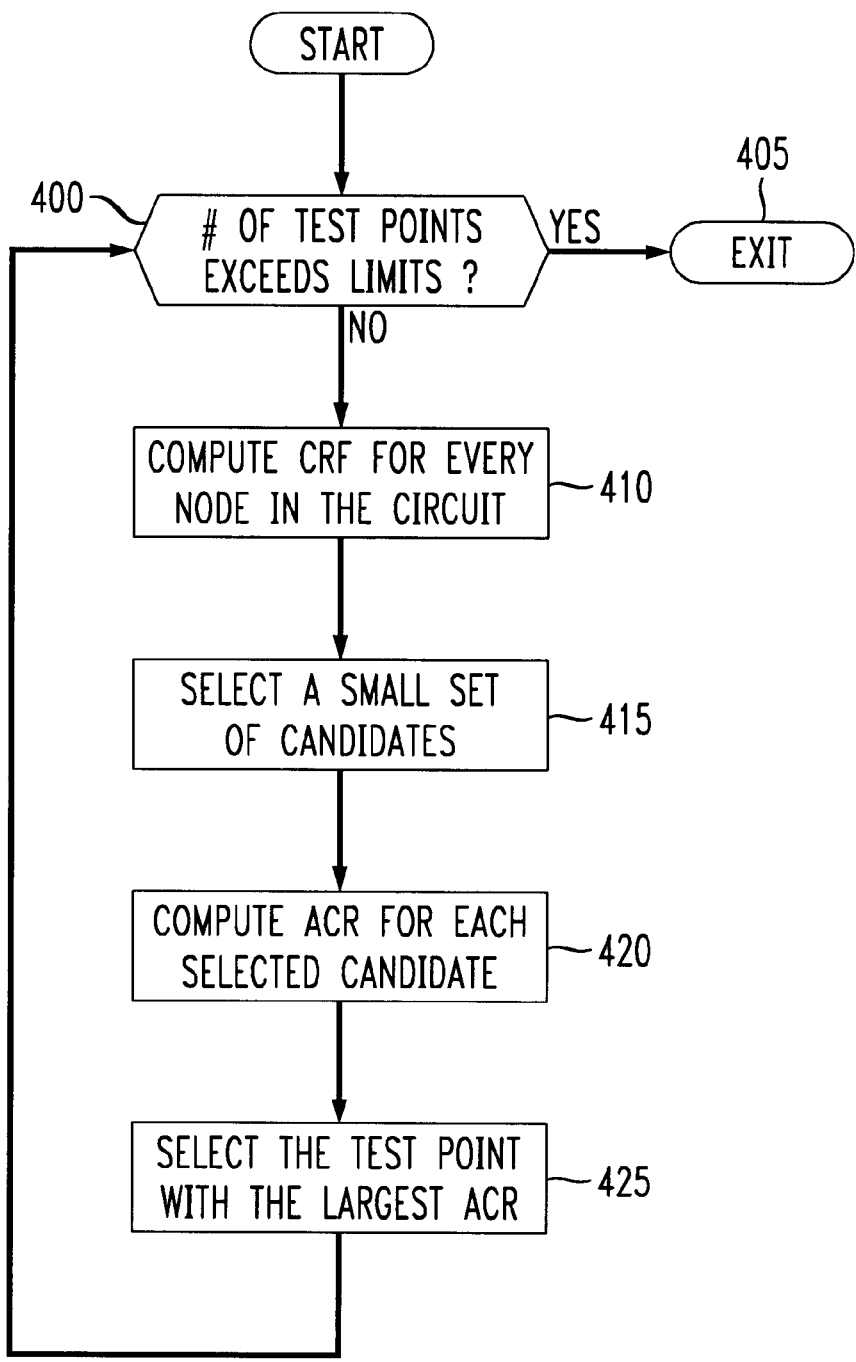
FIG. 4 is a flow chart of the prior art CRF-based algorithm for selecting a test point.

The previous description has been directed to test point selection for a sequential circuit converted to a full-scan design in which the network N in FIG. 1 is combinational. In an alternative embodiment, the sequential circuit may be converted to a partial-scan design in which only a limited number of flip-flops in the sequential circuit are replaced by scan flip-flops and the network N in FIG. 1 is a near acyclic circuit (NAC). A NAC is defined as a synchronous sequential circuit whose corresponding directed graph G does not contain any cycle of length greater than one, e.g. the network N does not contain flip-flop loops (two or more daisy-chained flip-flops) but may contain one or more self-loop flip-flops (SLFF) with their output coupled directly to their input. In a NAC flip-flops are classified as either SLFFs or non-self-loop flip-flops (non-SLFF). A SLFF is a flip-flop which has its output coupled to its input, either directly, or through one or more gates.

In a NAC, feedback lines exist in the network so that the direct computation of COP testability values may require several time consuming iterations to converge. Therefore, for partial scan NAC circuits a symbolic testability computation procedure is initially performed before calculating the HCR to eliminate iterations and hence reduce the complexity.

During the symbolic testability computation procedure the NAC is initially decomposed into blocks to simplify the probabilistic calculations. A block is a set of logic gates and non-SLFFs feeding a SLFF or a primary output of the circuit. A self-loop flip-flop block (SLFFB) includes a SLFF and a logic cone including only logic gates and non-SLFFs.

Figure 8A:
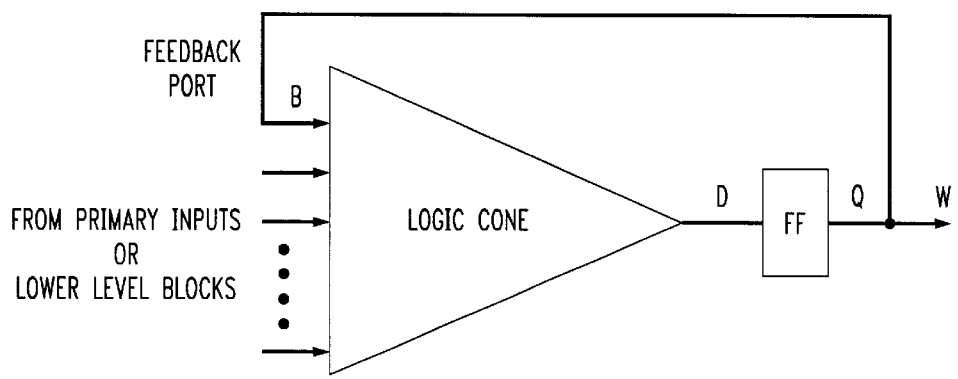
FIG. 8a depicts a self-loop flip flop block.

An input of the logic cone is either a primary input, the output of the SLFF or the output of another SLFF and the output of the logic cone is connected to the input of the SLFF. FIG. 8a is a SLFFB wherein signal B is a feedback port, that is, an input of a gate inside the SLFFB, and is directly connected to the output of the SLFF.

Then the decomposed NAC is levelized by categorizing the SLFFBs into macro-levels. A derived circuit graph G' of an NAC is a graph where a vertex v, represents a SLFF, primary input or primary output and a directed edge from $v_i$ to $v_j$ represents a path between SLFF or primary input i to SLFF or primary output j. The Macro-level (ML) of a SLFF, a primary input or a primary output in a NAC is the node level of the corresponding vertex in the derived circuit graph G', where the node level of a vertex f is defined as ML=0 if f is a primary input; and ML=1+max(ML(k)) for all vertices k's that feed vertex f directly.

Figure 8B:
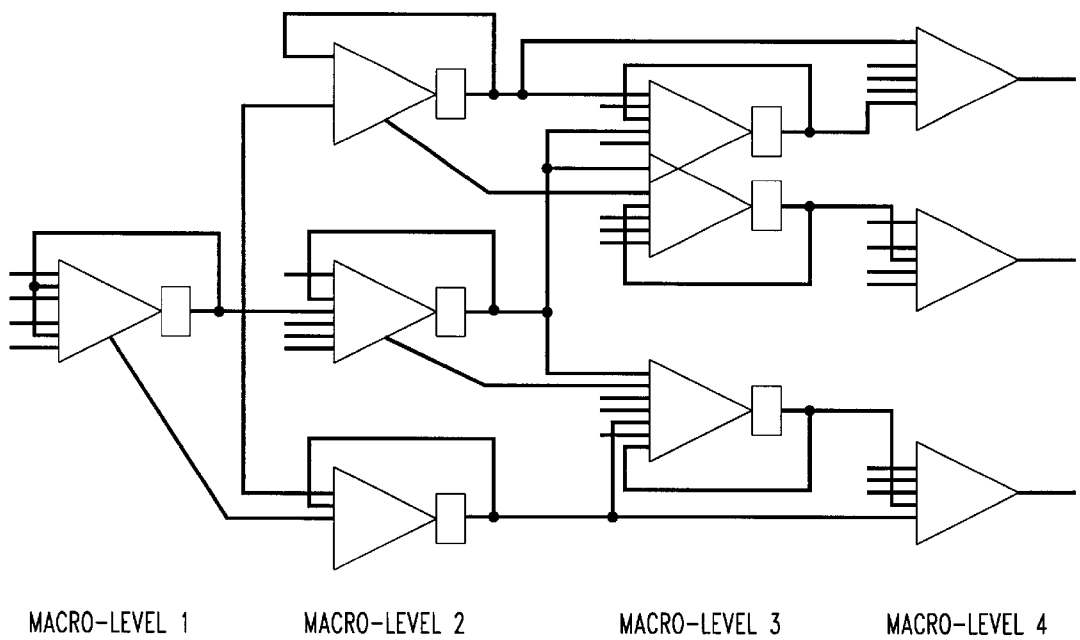
FIG. 8b is an illustrative example of a near acyclic circuit after decomposition and levelization.

An illustrative example of a decomposed and levelized circuit is shown in FIG. 8b. There is a feedback line for each SLFFB. The controllability and observability of each signal in a SLFFB are calculated using COP. Specifically, controllabilities are computed by traversing block by block from primary inputs to primary outputs. On the other hand, observabilites are computed by traversing the circuit from primary outputs toward primary inputs.

Before starting the controllability computation, the controllabilities at the inputs of the target block, which is either primary inputs or outputs of lower macro-level SLFFBs, must first be calculated. A symbolic variable x is assigned to the feedback port B. COP is then used to compute the controllabilities of internal signals. The controllabilities of the internal signals in the fanout cone of the feedback port B will be a polynomial of x. According to K. P. Parker and E. J. McCluskey, "Probabilistic Treatment of General Combinational Networks", *IEEE Transactions on Computers*, vol. 24, no. 6, pp. 668–670, June 1975, which is herein incorporated by reference, any high order exponents of x are preferably reduced or simplified to eliminate the inaccuracy caused by the correlation due to the re-convergent fanout originated from the feedback port variable x.

Figures 9A, 9B:
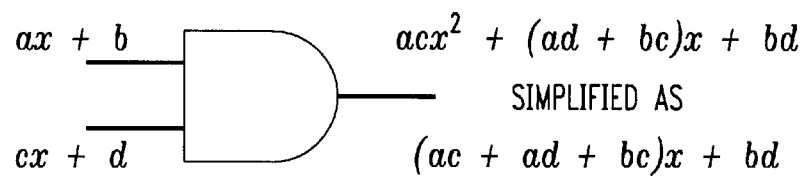
FIG. 9a is an illustrative example for computing the controllabilities for an AND gate using symbolic computation techniques.
FIG. 9b is an illustrative example for computing the observabilities of signals at a fanout stem.

By way of illustrative example, as shown in FIG. 9a, the controllabilities at the inputs of the AND gate are $C_1$=ax+b and $C_2$=cx+d. According to COP, the output controllability $C_O = C_1 \cdot C_2 = acx^2 + (ad+bc)x + bd$. Applying Parker and McCluskeys' theorem, the term $x^2$ is simplified to x to correct the inaccuracy caused by the dependency between these two input signals originating from the feedback port B. This simplification increases the accuracy of the controllability measures and simplifies the expression of the controllability function of any internal signal as a linear function of x. The flip-flop is modeled as a straight line with a data input and a data output having identical controllabilities. Therefore, if the controllability at the input of the SLFF D is ax+b where a and b are constants, the controllability at B and at internal signals in the fanout cone of B are calculated by solving the equation x=ax+b. After solving for the variable x the controllabilites of all signals of the SLFFB can then be calculated.

Once the controllabilities of all signals have been calculated then the observabilities may be computed. Referring to FIG. 8a the observabilities of signals within a SLFFB is represented by the variable x. The observability at Q may be represented by the equation $O_Q = 1-(1-O_W)(1-O_B) = ax+b$, where $O_W$ is the observability at W and $O_B$ is the observability at B. Since the controllabilities of all signals are calculated before the computation of observabilities, the observabilities of the internal signals can be expressed as a polynomial of x. During the computation, when a fanout stem is reached as shown by way of example in FIG. 9b, the observability at the fanout stem with two fanout branches is a quadratic function of x if both a and c are non-zero numbers. In general, the observability of an internal signal of a block is a polynomial of x. To maintain the observability of every signal in the block to be a linear function of x, we once again reduce or simplify the second order components. Note that the second order term arises from the re-convergence of the two fanout branches. When both coefficients a and c in FIG. 9b are non-zero, these two fanout branches must converge and the value derived by COP is not exact. Thus, simplifying the higher order exponents results in more accurate observability values. By simplifying the high order exponent at the fanout stem during the computation, the observability function of any signal in the block is reduced to a linear function of x or a constant and is, in general, in the form ax+b.

The calculation of observability gradients, $G_O$, is performed block by block from lower macro-level blocks towards higher macro-level blocks. Computation begins by initializing $G_O$ values at primary input nodes based on the node's controllability and observability values. Before computation of a block, the $G_O$ values are calculated at the inputs of the block, except for the feedback port. The $G_O$ values for all other nodes are derived by recursively applying the chain rule for all gates in the forward path, as described by Lisanke et al., "Testability-Driven Random Test Pattern Generation", *IEEE Transactions on Computer-Aided Design*, vol. CAD-6, no. 6 pp. 1082–1087, Nov. 1987, which is herein incorporated by reference. The $G_O$ value at the feedback port is assigned a symbolic variable x. Applying the chain rule, the $G_{Ok}$ value for any signal k in the block is a linear function of x. If the $G_O$ value at the input of the SLFF D is ax+b, where a and b are constants, the $G_O$ value at the feedback port B and, in turn, those at internal signals in the fanout cone of B are determined by solving the equation x=ax+b.

Once the observability gradients for all signals have been calculated, the controllability gradients may be calculated. The controllability gradients are determined block by block from the higher macro-level blocks toward the lower macro-level blocks. For each block the controllability gradient $G_C$ of the feedback port B is assigned a symbolic variable x. The chain rule for the controllability gradient is used to calculate the controllability gradients at internal signals of the block. Likewise, the $G_C$ values for all signals in the block can be expressed as a linear function of x. Therefore, the controllability gradients for a NAC may be determined without iteration.

Figure 10:
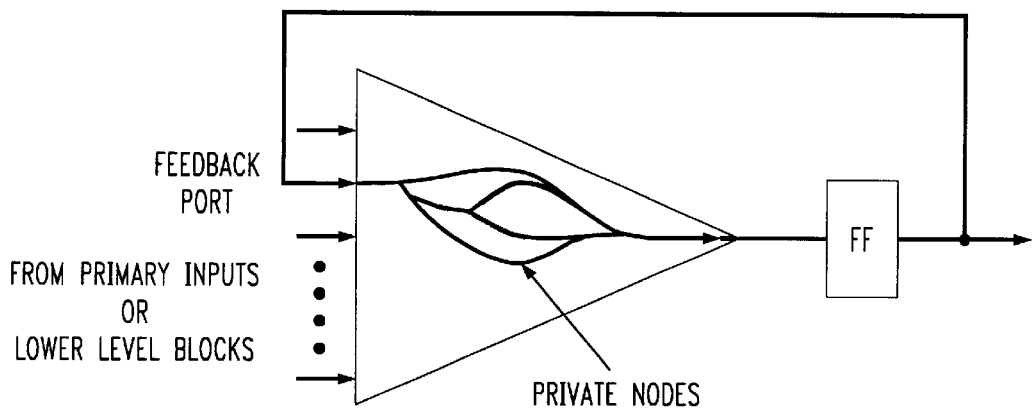
FIG. 10 depicts the private nodes of a self-loop flip-flop block.

Before calculating the HCRs for a NAC, the private nodes of every SLFFB must first be identified. The private nodes of a SLFFB are those nodes which lie on a path between the SLFF and a feedback port as shown in FIG. 10. In a NAC, a private node of one SLFFB can not be a private node of any other SLFFB. To propagate the controllability changes, the HCR method as described above with respect to a full-scan circuit is used, except that during the propagation of controllability changes, if the node is the SLFF of a SLFFB, then the event propagation is stopped and the new controllabilities of all private nodes of the SLFFB are calculated. Some new events may occur once the new controllabilities of all private nodes are updated. However, a private node need not be scheduled into the event list because its controllability value is stable. Therefore, further propagating a new event will not produce any event which affects the private nodes of the current SLFFB and, thus no iterative process is required.

Figure 11:
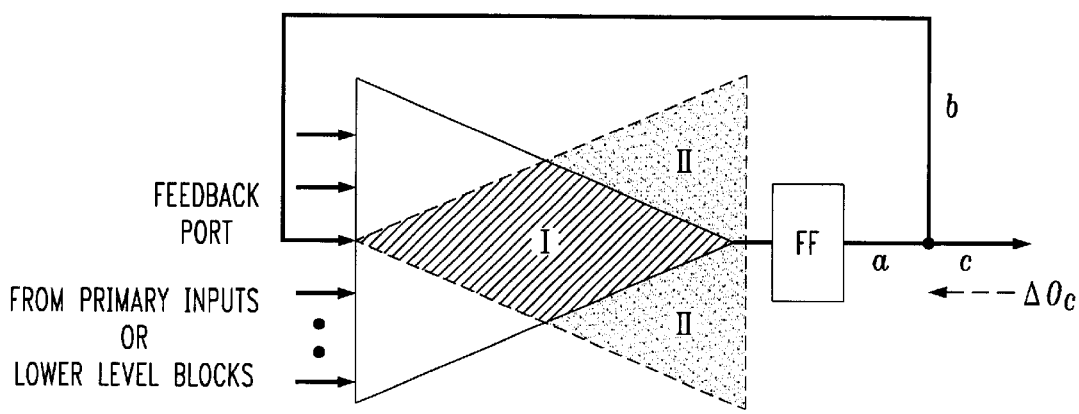
FIG. 11 is a graphical representation of the effect of propagating observability changes in a self-loop flip-flop.
Figure 12A:
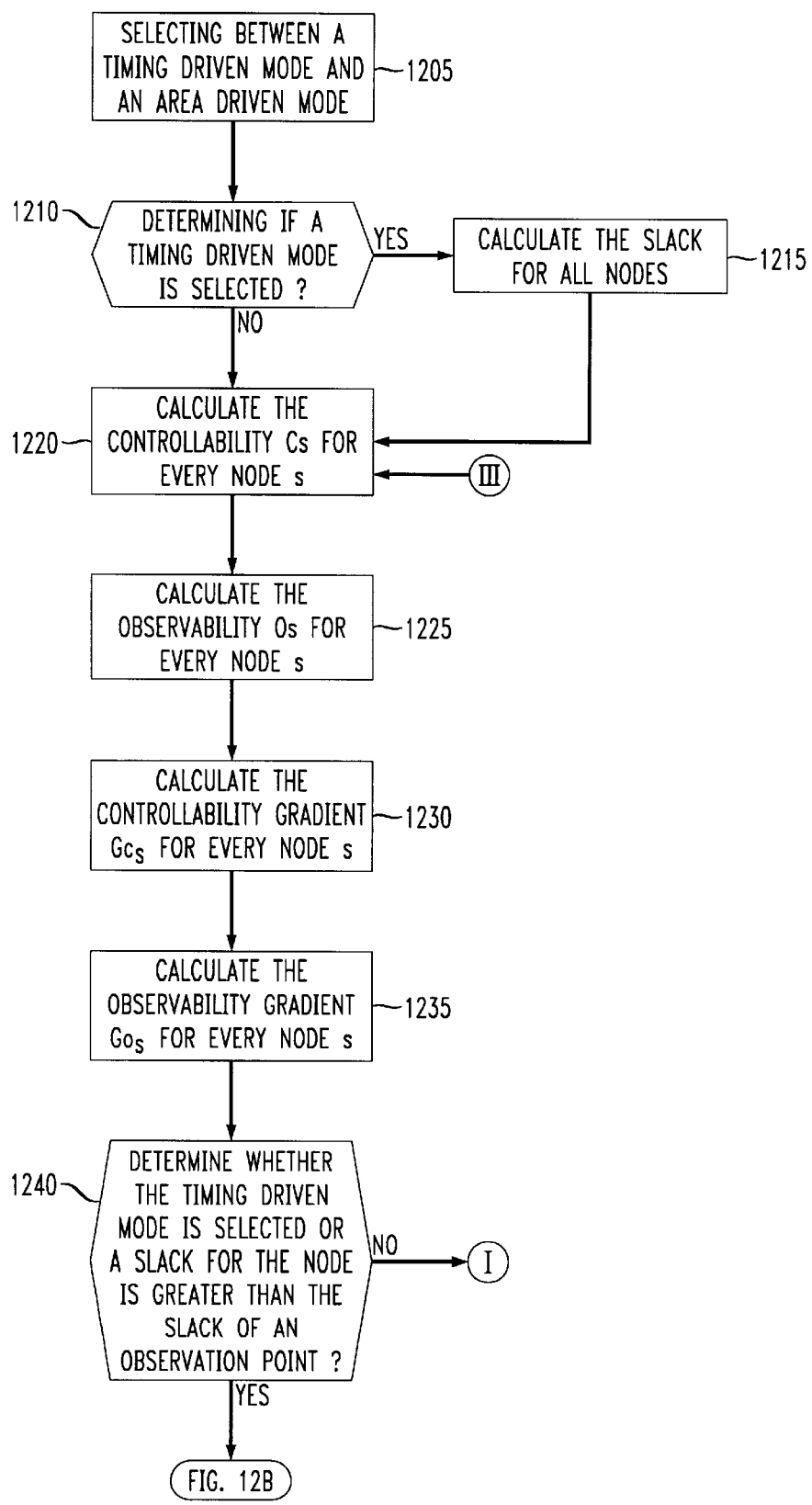
FIGS. 12a through 12d are a flow chart of a method for computing the hybrid cost reduction for a full-scan BIST in accordance with the present invention.
Figure 12B:
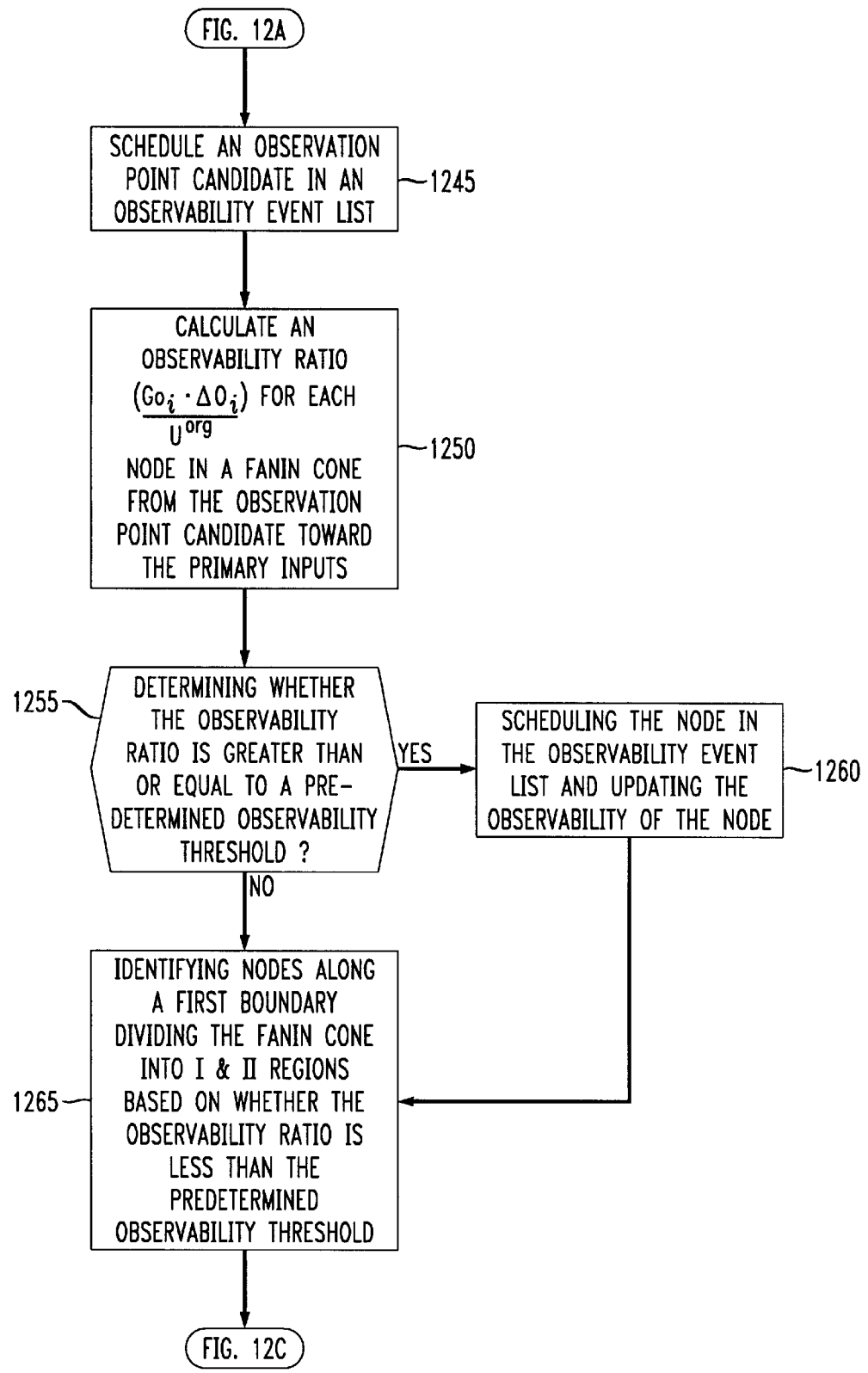
Figure 12C:
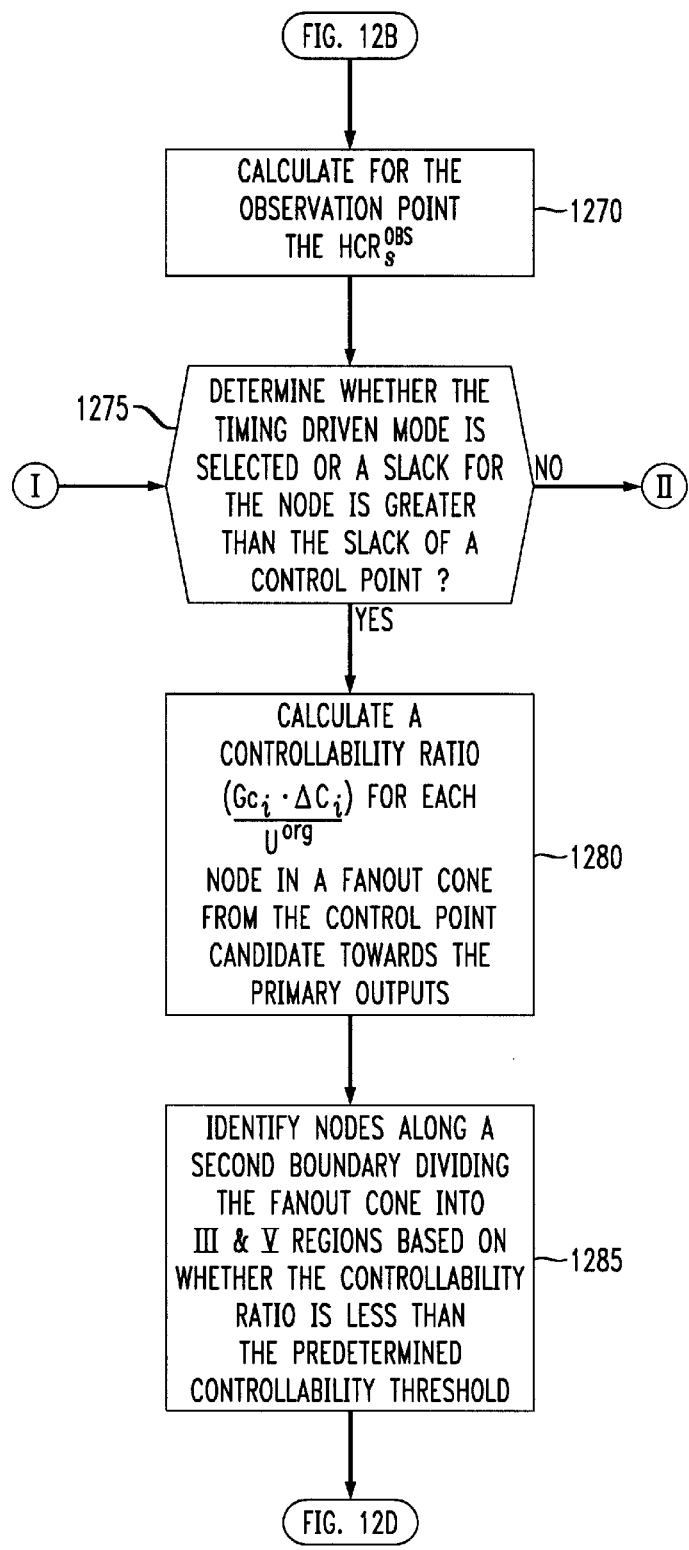
Figure 12D:
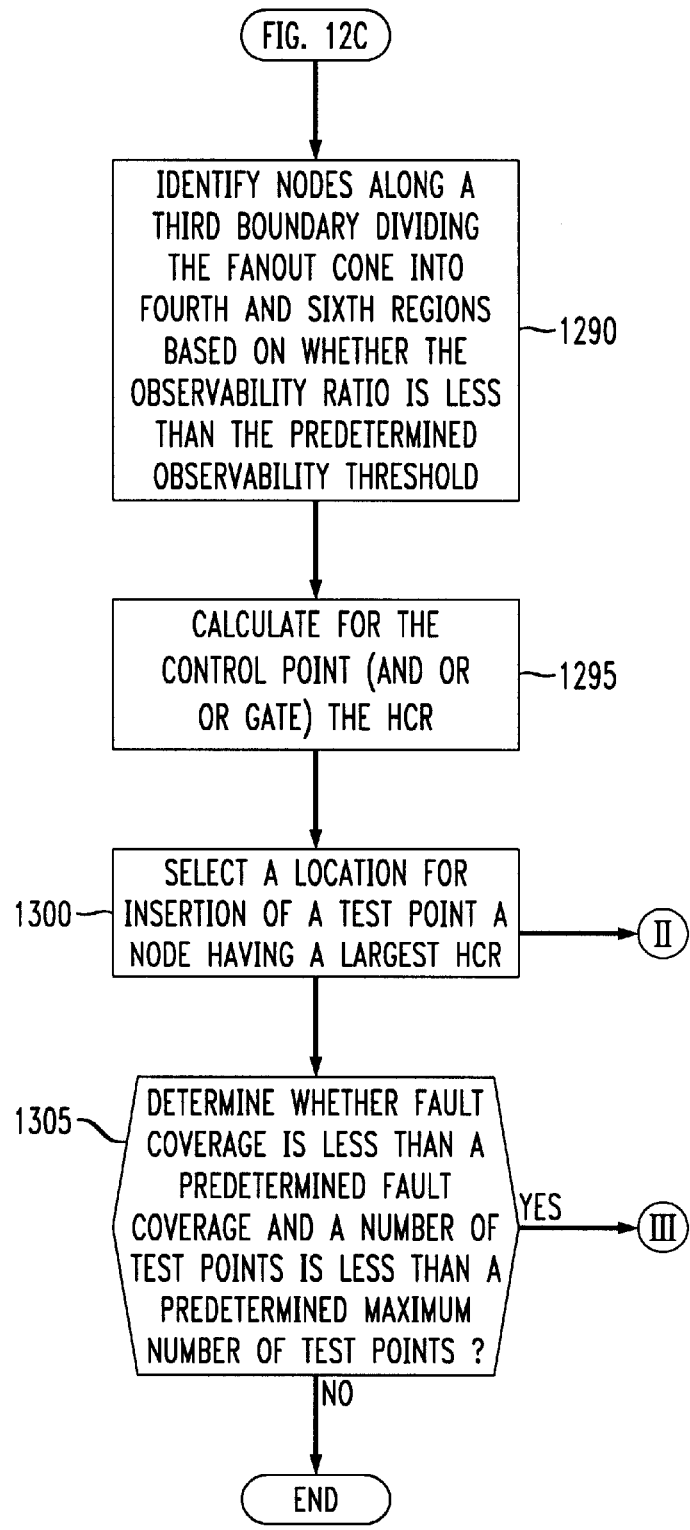

In order to propagate observability changes $\Delta O_C$ of the SLFFB in FIG. 11 if the node is the SLFF and $\Delta O_C$ is propagated from signal c the ideal case for computing the new observability at signal a would be to rely on the new observabilities of the nodes in region II in order to calculate the new observabilities of nodes in region I using the symbolic procedure. Because event propagation is performed level by level, to realize this ideal case, some events would have to be postponed until all events associated with signals in region II are processed. Maintaining such information during the computation of HCR requires an excessive amount of overhead. Therefore, the same method for calculating the HCR as described above with respect to the full-scan circuit is employed with the exception that the new observability for a signal is computed only once to prevent the iterative process caused by the feedback lines. In this regard, the same computational complexity is maintained regardless of whether the circuit is full or partial-scan.

C. Timing Critical Paths

In both full and partial-scan based BIST insertion of test points on critical paths may cause performance degradation. In particular, timing-critical nets are generally topologically distant from primary inputs, primary outputs, or both and thus, tend to have lower testabilities than other nets. It is, however, not necessary to add test points directly at timing-critical nets. To minimize the performance impact due to the insertion of a test point, timing analysis may first be performed and the slack of each signal determined, as described by Cheng and Chih-Jen, "Timing-Driven Test Point Insertion for Full-Scan and Partial-Scan BIST", *IEEE International Test Conference* (1995), which is herein incorporated by reference. For any given circuit, initially timing analysis is performed and the slack of each signal is recorded. The slack of a signal is defined as the difference between the required arrival time and the actual arrival time of the signal. Then, for each signal, a testability improvement factor is calculated to estimate the improvement on random pattern testability as a result of insertion of a test point. The calculation of the testability improvement factor is performed in linear time using a gradient method. A set of signals whose timing slacks as well as the testability improvement factors are larger than a predetermined threshold are selected as test point candidates. The slacks of all signals are recalculated after a new test point has been inserted and this process continues until a pre-specified number of test points have been selected. Substantially zero performance degradation can be realized by selecting an appropriate slack threshold.

Figure 7:
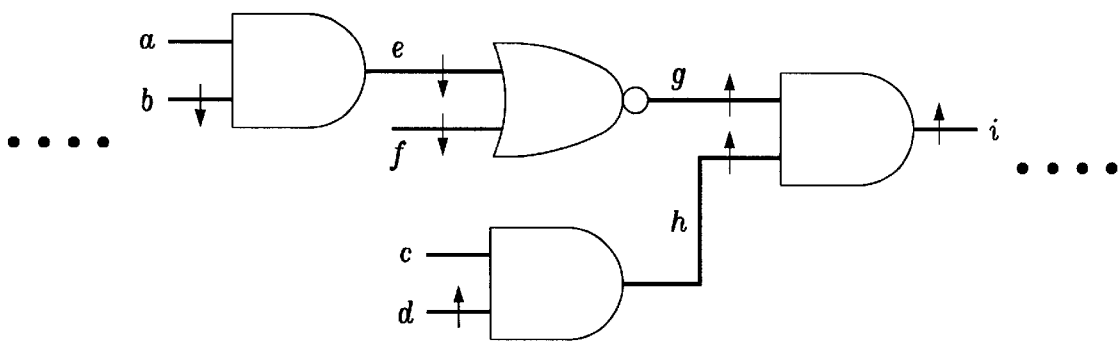
FIG. 7 shows an illustrative example of the addition of test points at non-critical timing paths in the circuit in order to improve the overall testability of the circuit.

In some locations insertion of test points is not permitted due to timing constraints and in these circumstances additional test points may be added to resolve the testability problems at a timing-critical net. FIG. 7 shows this situation by way of illustrative example. Suppose in FIG. 7 that it is desirable to increase the controllability signal i in order to improve the controllability as denoted up the arrow pointing upwards. If signals a, c, e, g, h and i are all at timing-critical paths, the controllability at i may be increased by decreasing the controllability at b and f while increasing the controllability at d, where b, f and d are not timing-critical paths.

A flow chart of the inventive method for test point selection for a full-scan-based BIST is shown in FIGS. 12a–12d. A timing driven signal is used to control between two modes, e.g. a timing driven mode and an area driven mode. On the one hand, if the area driven mode is selected the objective is to minimize the number of test points. On the other hand, if the timing driven mode is selected the objective is to reduce performance degradation.

Initially in step 1205 one of a timing driven mode or an area driven mode is selected. If the timing driven mode is selected then in step 1215 the slack for all nodes is determined. Otherwise, in steps 1120–1235 the controllability $C_s$, observability $O_s$ controllability gradient $G_{C_s}$ and observability gradient $G_{O_s}$ are calculated for every node s. Then, in step 1240 a determination is made whether the timing driven mode is selected or a slack for the node is greater than the slack of an observation point. If neither event is satisfied then the method advances to step 1275. On the other hand, if at least one event is satisfied then in step 1245 an observation point candidate is scheduled into an observability event list and in step 1250 the observability ratio is calculated for each node in a fanin cone starting from the observation point candidate toward the primary inputs. If the observability ratio is greater than or equal to a predetermined observability threshold in step 1255 then the node is scheduled into the observability event list and the observability of the node is updated. Otherwise, the nodes are identified along a first boundary dividing the fanin cone into a first region and a second region, a wherein the nodes in the first region have an observability ratio that is greater than or equal to the predetermined observability threshold and noes in the second region have an observability ratio less than the predetermined observability threshold. In step 1270, the HCR for the observation point is calculated.

Now the process calculates the HCR for a control point. Initially, a determination is made in step 1275 as to whether the timing driven mode is selected or a slack for the node is greater than the slack of a control point. If so, then the method advances to step 1295. Otherwise, the controllability ratio is calculated for each node in a fanout cone from the control point candidate towards the primary outputs. In step 1285 nodes are identified along a first boundary dividing the fanout cone into first and third regions, wherein the nodes in the first region have a controllability ratio greater than or equal to the predetermined controllability threshold and nodes in the third region have a controllability ratio less than the predetermined controllability threshold. Then, in step 1290 nodes are identified along a second boundary dividing the fanout cone into second and fourth regions, wherein the observability ratio of the nodes in the second region is greater than or equal to the predetermined observability threshold and the observability ratio of the nodes in the fourth region is less than the predetermined observability threshold. The HCR for a control point, which is either an AND gate or an OR gate, is calculated in step 1295. Based on the calculated HCR values a location for insertion of a test point is selected as the node having the largest HCR value. This iterative process is repeated so that a test point is selected during each iteration. The process terminates when the fault coverage is greater than or equal to a predetermined fault coverage and a number of test points is equal to a predetermined maximum number of test points.

A similar process is performed for a partial-scan circuit including a NAC with a few exceptions. In particular, initially the NAC is decomposed into blocks comprising a set of logic gates and non-SLFF feeding the plural primary outputs or a SLFF and the decomposed circuit is levelized into macro-levels. In addition, as described above the method for calculating the controllabilities, observabilities, controllability gradient and observability gradient in steps 1220–1235 differ since the partial-scan BIST includes a NAC.

Figure 13C:
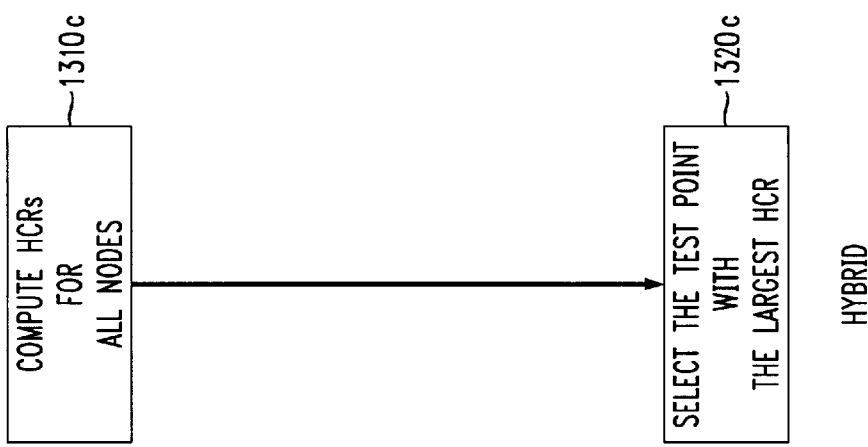
FIG. 13c is a flow chart summarizing the hybrid cost reduction method for selecting test points in accordance with the present invention.
Figure 13B:
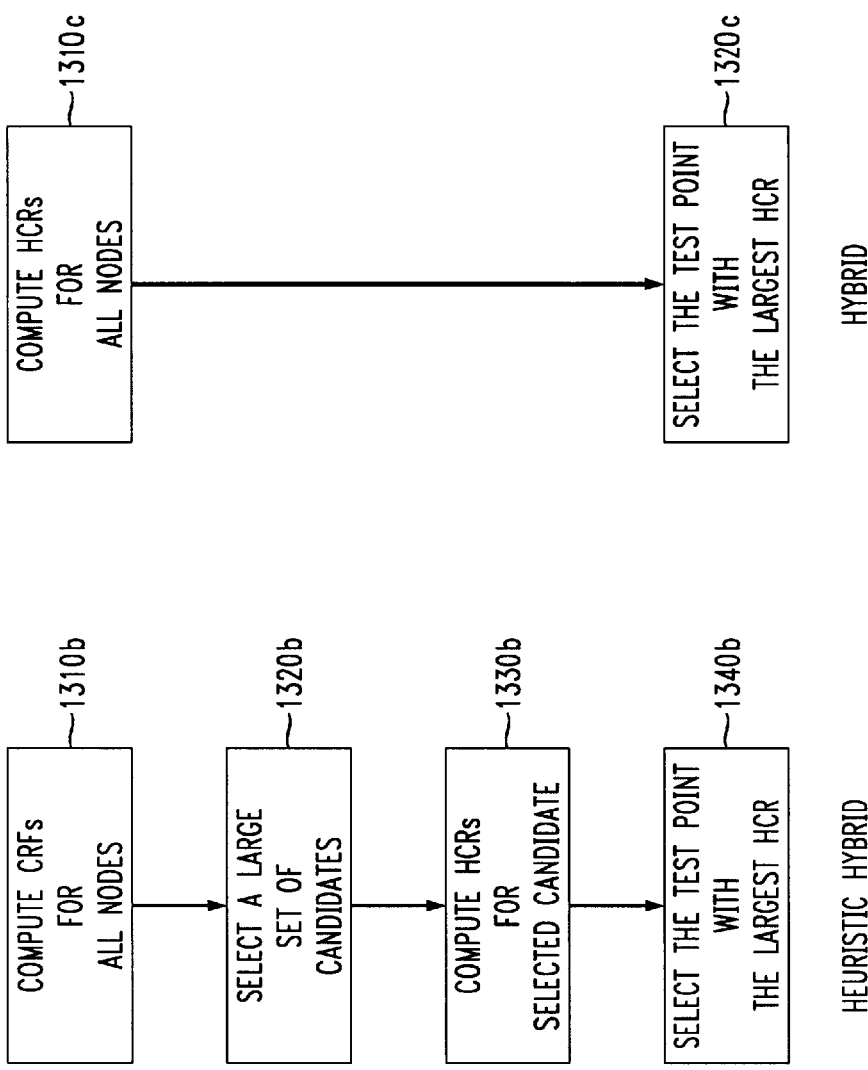
FIG. 13b is a flow chart of an alternative heuristic hybrid cost reduction method for selecting test points in accordance with the present invention.
Figure 13A:
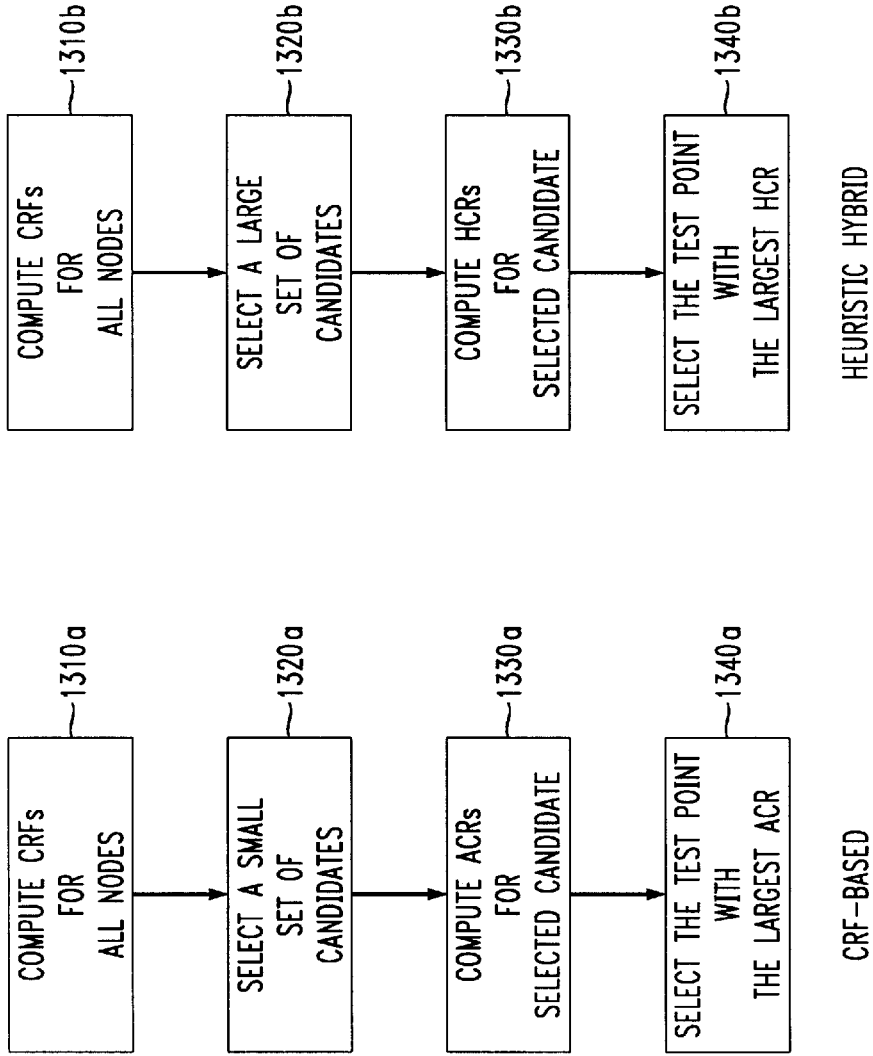
FIG. 13a is a flow chart of a prior art CRF-based method for selecting test points.

In an alternative embodiment the HCR method described above in which the ACRs for each selected candidate is computed, may be simplified using a heuristic hybrid algorithm in order to improve its efficiency. The flow charts for the conventional CRF-based method, the heuristic HCR method and the HCR method are shown in FIGS. 13a, 13b, and 13c, respectively. In accordance with the heuristic HCR the CRFs for all nodes are computed in step 1310b. Then, in step 1320b a relatively large set of candidates are selected based on the CRF values. Instead of calculating the HCRs for all nodes in the circuit as in the HCR method of FIG. 13c, the HCRs for only the selected candidates are calculated using the heuristic HCR method in FIG. 13b. Since the heuristic hybrid method calculates the HCR for only a set of candidates this technique is faster than the hybrid algorithm in which the HCR is determined for all nodes. Lastly, in step 1340b the test point with the largest HCR is selected. The method selects one test point per iteration until either the circuit under test reaches a desired fault coverage or the total number of test points is equal to a pre-specified limit.

The inventive HCR method is advantageous over the convention CRF-based method in that it achieves higher fault coverages and requires significantly less CPU time, especially for relatively large circuits. The significant reduction of CPU time is a result of eliminating computation of ACRs for selected candidates in the CRF-based method.

Thus, while there have been shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those method steps which perform substantially the same function in substantially the same way to achieve the same results are within the scope of the invention. It is the intention, therefore, to be limited only as indicated by the scope of the claims appended hereto.

We claim:

1. A method for selecting test points for a full-scan based built-in self-test circuit under test having a plurality of primary inputs and a plurality of primary outputs, said method comprising the steps of:

(a) calculating a controllability for every node in the circuit under test;

(b) calculating an observability for every node in the circuit under test;

(c) calculating a controllability gradient for every node in the circuit under test;

(d) calculating an observability gradient for every node in the circuit under test;

(e) evaluating a hybrid cost reduction for an observation point, wherein step (e) comprises:

(f) scheduling an observation point candidate in an observability event list;

(g) calculating an observability ratio for each node in a fanin cone starting from the observation point candidate toward the primary inputs, the observability ratio being defined as $$(G_{Oi} \Delta O_i)/U^{org}$$

where $G_{Oi}$ is an observability gradient of fault i;

$\Delta_{Oi}$ is a change in observability of fault i;

$U^{org}$ is a cost reduction factor before insertion of a test point candidate;

(h) determining whether the observability ratio is greater than or equal to a predetermined observability threshold, wherein if the observability ratio is greater than or equal to the predetermined observability threshold scheduling the node in the observability event list and updating observability of the node;

(i) identifying nodes along a first boundary dividing the fanin cone into a first region and a second region, wherein nodes in the first region have a corresponding observability ratio that is greater than or equal to the predetermined observability threshold and nodes in the second region have a corresponding observability ratio that is less than the predetermined observability threshold;

(j) calculating for the observation point the hybrid cost reduction defined as $$HCR_s^{OBS} = \sum_{i \in region\ I} \left(\frac{1}{Pd_i^s} - \frac{1}{Pd_i^{org}}\right) + \sum_{j \in Boundary\ I} (G_{oj} \cdot \Delta O_j) + \left(\frac{1}{Pd_{s/1}} + \frac{1}{Ps_{s/0}}\right)$$

where
s represents a test point;
i represents faults in the first region;
j represents nodes on the first boundary;
$Pd_i^{org}$ and $Pd_i^s$ are detection probabilities of fault i before and after insertion of a test point s;
$G_{Oj}$ is an observation gradient of node j;
$\Delta O_j$ represents a change in observability of node j; and
$Pd_{s/1}$ and $Pd_{s/0}$ are detection probabilities for stuck-at fault "1" and for stuck-at fault "0" for a node due to insertion of the test point s;

(k) evaluating a hybrid cost reduction for a control point for one of an AND gate and an OR gate, wherein step (k) comprises:

(l) calculating for each node in a fanout cone from the control point candidate towards the primary outputs a controllability ratio, the controllability ratio being defined as $$(G_{Ci} \cdot \Delta C_i)/U^{org}$$

where
$G_{Ci}$ is a controllability gradient of fault i;
$\Delta C_i$ is a change in controllability of fault i;
$U^{org}$ is a cost reduction factor before insertion of a test point candidate;

(m) identifying nodes along a first boundary dividing the fanout cone into a first region and a third region based on the comparison, wherein the nodes in the first region have a corresponding controllability ratio that is greater than or equal to the predetermined controllability threshold and the nodes in the third region have a corresponding controllability ratio that is less than the predetermined controllability threshold;

(n) identifying nodes in the fanin cone starting from the first boundary toward the primary inputs along a second boundary dividing the fanout cone into a second region and a fourth region, wherein the observability ratio of the nodes in the second region is greater than or equal to the predetermined observability threshold and the observability ratio of the nodes in the fourth region is less than the predetermined observability threshold;

(o) calculating for the control point candidate the hybrid cost reduction for one of an AND gate and an OR gate defined as $$HCR_s^{OR} = \sum_{i \in region\ I+II} \left(\frac{1}{Pd_i^s} - \frac{1}{Pd_i^{org}}\right) + \sum_{k \in Boundary\ I} (Gc_K \cdot \Delta C_k) + \sum_{j \in Boundary\ II} (G_{oJ} \cdot \Delta O_j) + \left(\frac{1}{Pd_{s/0}} + \frac{1}{Ps_{t/0}}\right)$$

$$HCR_s^{AND} = \sum_{i \in region\ I+II} \left(\frac{1}{Pd_i^s} - \frac{1}{Pd_i^{org}}\right) + \sum_{k \in Boundary\ I} (Gc_k \cdot \Delta C_k) + \sum_{j \in Boundary\ II} (G_{oj} \cdot \Delta O_j) + \left(\frac{1}{Pd_{s/1}} + \frac{1}{Ps_{t/1}}\right)$$

where
s represents a test point;
t represents a test input;
i represents faults in the first and second regions;
j represents nodes on the first boundary;
k represents nodes on the second boundary;
$Pd_i^{org}$ and $Pd_i^s$ are detection probabilities of fault i before and after insertion of a test point s;
$G_{Ck}$ is a controllability gradient of node k;
$\Delta C_k$ is a change in controllability of node k;
$G_{Oj}$ is an observation gradient of node j;
$\Delta O_j$ represents a change in observability of node j; and
$Pd_{s/0}$ and $Pd_{t/0}$ are detection probabilities for stuck-at fault "0" for a node due to insertion of the test point s and the test input t;
$Pd_{s/1}$ and $Pd_{t/1}$ are detection probabilities for stuck-at fault "1" for a node due to insertion of the test point s and the test input t;

(p) selecting a location for insertion of a test point a node having a corresponding largest hybrid cost reduction; and (q) determining whether a fault coverage is less than a predetermined fault coverage and a number of test points is less than a predetermined maximum number of test points, wherein if the fault coverage is less than the predetermined fault coverage and the number of test points is less than the predetermined maximum number of test points then repeating step (a).

2. The method in accordance with claim 1, before step (a) further comprising selecting from one of a timing driven mode and an area driven mode, wherein if a timing driven mode is selected computing slacks for all nodes in the circuit under test.

3. The method in accordance with claim 2, wherein step (e) comprises determining for each node in the circuit under test whether one of the timing driven mode is selected and a slack due to insertion of an observation point is less than a slack of the node, wherein if one of the area driven mode is selected and a slack due to insertion of an observation point is greater than or equal to a slack of the node, performing step (k).

4. The method in accordance with claim 3, wherein step (k) comprises determining for each node in the circuit under test whether one of the timing driven mode is selected and a slack due to insertion of a control point is less than a slack of the node, wherein if one of the area driven mode is selected and a slack due to insertion of a control point is greater than or equal to a slack of the node performing step (p).

5. A method for selecting test points for a partial-scan based built-in self-test circuit under test including a near acyclic circuit, a plurality of primary inputs, and a plurality of primary outputs, said method comprising the steps of:

(a) calculating a controllability for every node in the circuit under test;

(b) calculating an observability for every node in the circuit under test;

(c) calculating a controllability gradient for every node in the circuit under test;

(d) calculating an observability gradient for every node in the circuit under test;

(e) evaluating a hybrid cost reduction for an observation point, wherein step (e) comprises:

(f) scheduling an observation point candidate in an observability event list;

(g) calculating an observability ratio for each node in a fanin cone starting from the observation point candidate toward the primary inputs, the observability ratio being defined as $$(G_{Oi} \cdot \Delta O_i)/U^{org}$$

where $G_{Oi}$ is an observability gradient of fault i;
$\Delta O_i$ is a change in observability of fault i;
$U^{org}$ is a cost reduction factor before insertion of a test point candidate;

(h) determining whether the observability ratio is greater than or equal to a predetermined observability threshold, wherein if the observability ratio is greater than or equal to the predetermined observability threshold scheduling the node in the observability event list and updating observability of the node;

(i) identifying nodes along a first boundary dividing the fanin cone into a first region and a second region, wherein nodes in the first region have a corresponding observability ratio that is greater than or equal to the predetermined observability threshold and nodes in the second region have a corresponding observability ratio that is less than the predetermined observability threshold;

(j) calculating for the observation point the hybrid cost reduction defined as $$HCR_s^{OBS} = \sum_{i \in region\ I} \left(\frac{1}{Pd_i^s} - \frac{1}{Pd_i^{org}}\right) + \sum_{j \in Boundary\ I} (G_{oj} \cdot \Delta O_j) + \left(\frac{1}{Pd_{s/1}} + \frac{1}{Ps_{s/0}}\right)$$

where s represents a test point;
i represents faults in the first region;
j represents nodes on the first boundary;
$Pd_i^{org}$ and $Pd_i^s$ are detection probabilities of fault i before and after insertion of a test point s;
$G_{Oj}$ is an observation gradient of node j;
$\Delta O_j$ represents a change in observability of node j; and $Pd_{s/1}$ and $Pd_{s/0}$ are detection probabilities for stuck-at fault "1" and for stuck-at fault "0" for a node due to insertion of the test point s;

(k) evaluating a hybrid cost reduction for a control point for one of an AND gate and an OR gate, wherein step (l) comprises:

(l) calculating for each node in a fanout cone from the control point candidate towards the primary outputs a controllability ratio, the controllability ratio being defined as $$(G_{Ci} \cdot \Delta C_i)/U^{org}$$

where $G_{Ci}$ is a controllability gradient of fault i;
$\Delta C_i$ is a change in controllability of fault i;
$U^{org}$ is a cost reduction factor before insertion of a test point candidate;

(m) identifying nodes along a first boundary dividing the fanout cone into a first region and a third region based on the comparison, wherein the nodes in the first region have a corresponding controllability ratio that is greater than or equal to the predetermined controllability threshold and the nodes in the third region have a corresponding controllability ratio that is less than the predetermined controllability threshold;

(n) identifying nodes in the fanin cone starting from the first boundary toward the primary inputs along a seccond boundary dividing the fanout cone into a second region and a fourth region, wherein the observability ratio of the nodes in the second region is greater than or equal to the predetermined observability threshold and the observability ratio of the nodes in the fourth region is less than the predetermined observability threshold;

(o) calculating for the control point candidate the hybrid cost reduction for one of an AND gate and an OR gate defined as $$HCR_s^{OR} = \sum_{i \in region\ I+II} \left(\frac{1}{Pd_i^s} - \frac{1}{Pd_i^{org}}\right) + \sum_{k \in Boundary\ I} (Gc_K \cdot \Delta C_k) + \sum_{j \in Boundary\ II} (G_{Oj} \cdot \Delta O_j) + \left(\frac{1}{Pd_{s/0}} + \frac{1}{Ps_{t/0}}\right)$$

$$HCR_s^{AND} = \sum_{i \in region\ I+II} \left(\frac{1}{Pd_i^s} - \frac{1}{Pd_i^{org}}\right) + \sum_{k \in Boundary\ I} (Gc_k \cdot \Delta C_k) + \sum_{j \in Boundary\ II} (G_{Oj} \cdot \Delta O_j) + \left(\frac{1}{Pd_{s/1}} + \frac{1}{Ps_{t/1}}\right)$$

where s represents a test point;
t represents a test input;
i represents faults in the first and second regions;
j represents nodes on the first boundary;
k represents nodes on the second boundary;
$Pd_i^{org}$ and $Pd_i^s$ are detection probabilities of fault i before and after insertion of a test point s;
$G_{Ck}$ is a controllability gradient of node k;
$\Delta C_k$ is a change in controllability of node k;

$G_{Oj}$ is an observation gradient of node j;

$\Delta O_j$ represents a change in observability of node j; and $Pd_{s/0}$ and $Pd_{t/0}$ are detection probabilities for stuck-at fault "0" for a node due to insertion of the test point s and the test input t;

$Pd_{s/1}$ and $Pd_{t/1}$ are detection probabilities for stuck-at fault "1" for a node due to insertion of the test point s and the test input t;

(p) selecting a location for insertion of a test point a node having a corresponding largest hybrid cost reduction; and (q) determining whether a fault coverage is less than a predetermined fault coverage and a number of test points is less than a predetermined maximum number of test points, wherein if the fault coverage is less than the predetermined fault coverage and the number of test points is less than the predetermined maximum number of test points then repeating step (a).

6. The method in accordance with claim 5, before step (a) further comprising selecting from one of a timing driven mode and an area driven mode, wherein if a timing driven mode is selected computing slacks for all nodes in the circuit under test.

7. The method in accordance with claim 6, wherein step (e) comprises determining for each node in the circuit under test whether one of the timing driven mode is selected and a slack due to insertion of an observation point is less than a slack of the node, wherein if one of the area driven mode is selected and a slack due to insertion of an observation point is greater than or equal to a slack of the node, performing step (k).

8. The method in accordance with claim 7, wherein step (k) comprises determining for each 10node in the circuit under test whether one of the timing driven mode is selected and a slack due to insertion of a control point is less than a slack of the node, wherein if one of the area driven mode is selected and a slack due to insertion of a control point is greater than or equal to a slack of the node performing step (p).

9. The method in accordance with claim 5, before step (a) further comprising the steps of:

(r) decomposing the near acyclic circuit into blocks comprising a set of logic gates and non-self-loop flip-flops feeding one of the plural primary outputs and a self-loop flip-flop having a feedback port; and (s) levelizing the decomposed near acyclic circuit into a plurality of Macro-Levels of a vertex in a derived circuit graph of one of a self-loop flip-flop, a primary input, and a primary output in a derived circuit graph in the near acyclic circuit defined as ML=0 if the vertex is a primary input ML=1+max(ML(k)) for all vertices k's that directly feed the vertex.

10. The method in accordance with claim 9, wherein step (a) comprises computing controllabilities of each block from the primary inputs to the primary outputs.

11. The method in accordance with claim 10, wherein step (a) further comprises the steps of:

(t) assigning a symbolic variable to the feedback port of each self-loop flip-flop;

(u) expressing controllabilities of internal signals in the fanout cone of the feedback port as a polynomial function of the symbolic variable;

(v) simplifying a highest exponent of the polynomial function;

(w) deriving the value of the symbolic variable; and (x) calculating controllabilites of the internal signals in a fanout cone of each block based on the derived value of the symbolic variable.

12. The method in accordance with claim 11, wherein step (b) comprises computing observabilities for each block from the primary outputs to the primary inputs.

13. The method in accordance with claim 12, wherein step (b) comprises the steps of:

(y) assigning a symbolic variable to the feedback port of each self-loop flip-flop;

(z) expressing the observabilities of internal signals in the fanout cone of the feedback port as a polynomial function of the symbolic variable;

(aa) simplifying a highest exponent of the polynomial function;

(bb) deriving the value of the symbolic variable;

(cc) calculating observabilities of the internal signals in a fanout cone of each block based on the derived value of the symbolic variable.

14. The method in accordance with claim 13, wherein step (c) comprises calculating the observability gradient one block at a time from a lowest macro-level block toward a highest marco-level block.

15. The method in accordance with claim 14, wherein step (c) comprises the step of:

(dd) computing observation gradient values for input nodes of the self-loop flip-flop, except for the feedback port, based on the controllability and observability values;

(ee) assigning a symbolic variable to the feedback port of each self-loop flip-flop;

(ff) computing observation gradient values for all nodes as a linear function of the symbolic variable; and (gg) deriving the value of the symbolic variable.

16. The method in accordance with claim 15, wherein step (d) comprises calculating the controllability gradient one block at a time from a highest macro-level block toward a lowest marco-level block.

17. The method in accordance with claim 16, wherein step (d) comprises the step of:

(hh) computing observation gradient values for input nodes of the self-loop flip-flop, except for the feedback port, based on the controllability and observability values;

(ii) assigning a symbolic variable to the feedback port of each self-loop flip-flop;

(jj) computing observation gradient values for all nodes as a linear function of the symbolic variable; and (kk) deriving the value of the symbolic variable.

18. The method in accordance with claim 17, wherein step (k) further comprises identifying private nodes of each self-loop flip-flop block.

19. The method in accordance with claim 18, wherein step (l) comprises calculating the controllability ratio for each private node in the self-loop flip-flop block.

* * * * *